(12) United States Patent
Ludeman

(10) Patent No.: US 6,434,232 B1
(45) Date of Patent: Aug. 13, 2002

(54) APPARATUS AND METHOD FOR MEASURING LOOP IMPEDANCE

(75) Inventor: Christopher Ludeman, Palm Bay, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/378,962

(22) Filed: Aug. 23, 1999

(51) Int. Cl.[7] .......................... H04M 9/00; H04M 1/00; H04M 3/22

(52) U.S. Cl. .............................. 379/399.01; 379/26.01; 379/27.01; 379/30; 379/93.05; 379/377

(58) Field of Search .................................. 379/398–399, 379/27, 26.01–27.01, 29.01–29.04, 30

(56) References Cited

U.S. PATENT DOCUMENTS 4,206,648 A * 6/1980 Tuska et al.
6,178,241 B1 * 1/2001 Zhou

* cited by examiner

Primary Examiner—Forester W. Isen
Assistant Examiner—Ramnandan Singh
(74) Attorney, Agent, or Firm—Duane Morris LLP

(57) ABSTRACT

In a subscriber loop interface circuit, a novel method and apparatus for measuring loop impedance. Measurement of loop impedance including charging and discharging a capacitor using current derived from loop current and loop voltage. The discharge time interval of the capacitor may provide information on loop impedance. A look-up table in a subscriber loop interface circuit may include previously calculated impedance values corresponding to discharge time.

20 Claims, 3 Drawing Sheets

APPARATUS AND METHOD FOR MEASURING LOOP IMPEDANCE

BACKGROUND OF THE INVENTION

This invention relates to subscriber loop interface circuits and, more specifically, the invention relates to a method and apparatus in a subscriber loop interface circuit for measuring loop impedance.

A subscriber loop interface circuit ("SLIC") is generally employed as an interface between a subscriber network and a subscriber terminal device (such as a residential telephone). A SLIC may provide functions such as two-to-four wire conversion, battery feed, line supervision, or common mode rejection.

Generally, a subscriber loop includes a SLIC, a subscriber terminal device (e.g., a telephone), and a pair of subscriber lines for connecting the SLIC to the subscriber terminal device. When a subscriber terminal device is in an off-hook condition, the subscriber lines, subscriber terminal device, and SLIC together may form a continuous circuit for establishing two-way communications between the SLIC and the subscriber terminal device.

Typically, a SLIC includes circuitry for obtaining information on voltage levels across the subscriber lines (loop voltage) and for obtaining information on the current flowing in the subscriber loop (loop current). Typically, the obtained information is scaled and compared to references in order to evaluate loop voltage and/or loop current.

For example, a SLIC may detect an off-hook condition using loop voltage and/or loop current. For example, if loop current and/or loop voltage reaches a predetermined threshold, a SLIC may transmit a logic signal to a SLIC controller to indicate the detection of an off-hook condition. Further by of example, information on loop current and loop voltage may be used to control the supply of power to a subscriber loop by a SLIC.

Typically, measuring loop impedance and testing subscriber loop continuity requires invasive subscriber loop access relays and expensive test equipment.

In one prior art technique for measuring subscriber loop voltage, a voltage across the subscriber line pair is measured and converted into a single narrow pulse for the purpose of indicating the magnitude of the voltage. This technique may be inaccurate due to variations in capacitance value and manufacturing tolerance and may require a high frequency clock to provide the measurement resolution needed.

Accordingly, it is an object of the present invention to provide a novel method and apparatus for measuring subscriber loop impedance.

It is another object of the present invention to provide a novel method and apparatus in a semiconductor SLIC circuit for internally measuring subscriber loop impedance.

It is yet another object of the present invention to provide a novel method and apparatus for testing subscriber loop continuity in a SLIC formed from semiconductor material.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
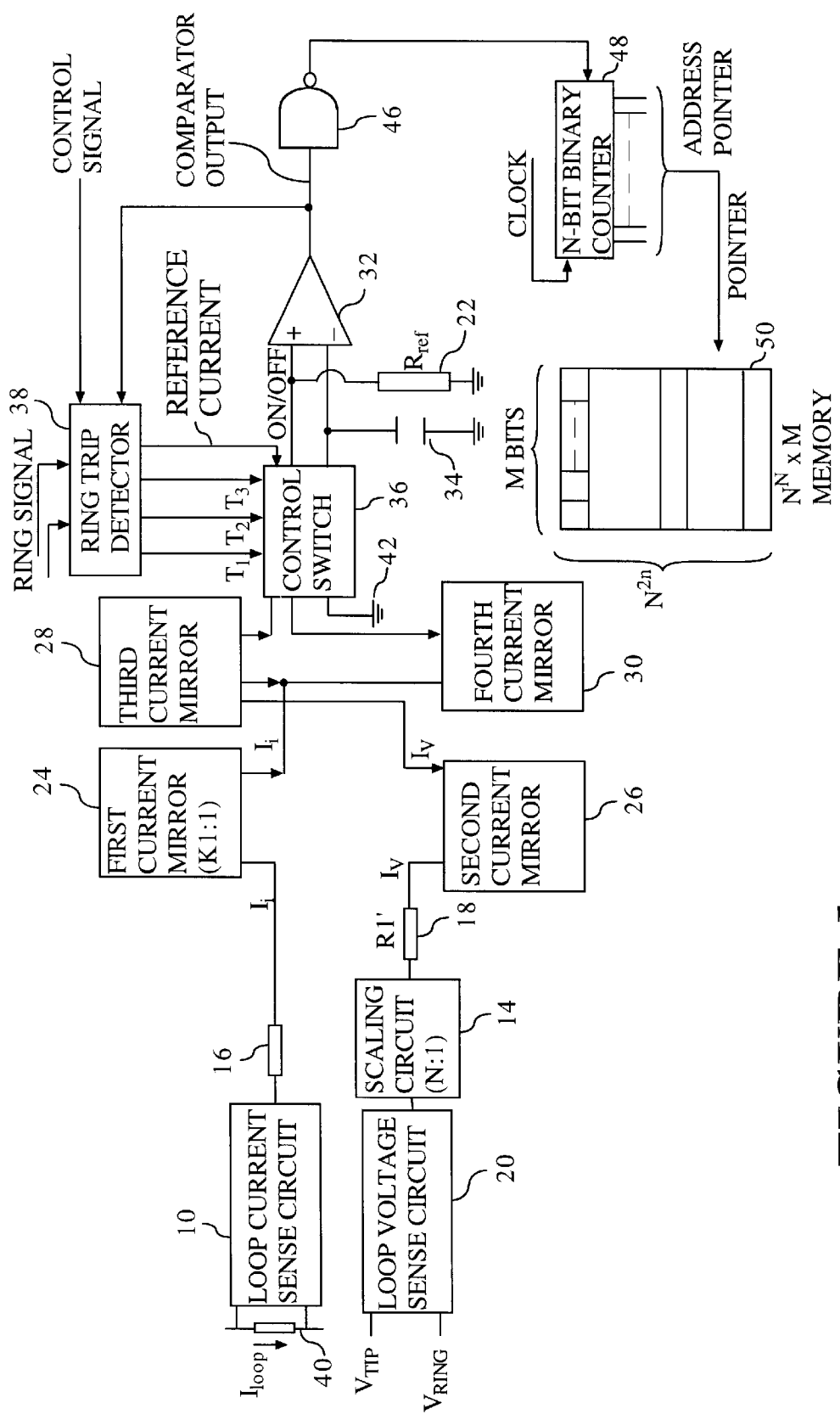
FIG. 1 is a functional block diagram illustrating one embodiment of a circuit in a subscriber loop interface circuit for measuring loop impedance of the present invention.

With reference to FIG. 1, in a SLIC, a circuit for measuring subscriber loop impedance may include a loop current sense circuit 10, a loop voltage sense circuit 20, a scaling circuit 14, four resistive elements 16, 18, 22, and 40, a first current mirror 24, a second current mirror 26, a third current mirror 28, a fourth current mirror 30, a comparator 32, a capacitor 34, a control switch 36, and a ring trip detector 38. Conventional SLIC's typically operate from a negative reference. FIG. 1 illustrates circuitry in a SLIC operating from a negative reference.

In operation, the loop voltage sense circuit 20 may obtain information on loop voltage by measuring the voltage across a pair of subscriber lines (e.g., TIP and RING). The loop voltage sense circuit 20 may generate a voltage proportional to the voltage across the subscriber lines. The voltage may be scaled (N to 1) by the scaling circuit 14. The scaled voltage may be directed through a resistive element 18 having a resistance of R1' ohms to provide a first current Iv.

The loop current sense circuit 10 may obtain information on loop current by measuring a voltage across a resistive element 40. Resistive element 40 may be a resistor of a predetermined value placed in series with one of the subscriber lines (e.g., TIP or RING). The loop current sense circuit 10 generates a voltage proportional to the measured loop current. The voltage generated is directed through a resistive element 16 and then directed to a first current mirror 24. The first current mirror 24 may perform a K1 to 1 scaling to provide a second current Ii.

Since both loop voltage and loop current measurements may vary in proportion to temperature and lot-to-lot variations of on chip elements, on or off-chip elements may be selected to ensure that the voltage and current measurement variations track each other.

The first current Iv may be provided to a second current mirror 26. The second current mirror 26 may provide the first current Iv to the third current mirror 28. The third current mirror 28 may generate two signals on separate lines that are each a duplicate of the first current Iv. One duplicate of the first current Iv may be added to the second current Ii to provide a third current. The addition of the first and second currents to provide the third current may be achieved by a nodal connection. The fourth current mirror 30 may generate a duplicate of the third current.

The control switch 36 may have three states. In a first state, the control switch 36 may connect the capacitor 34 to the third current mirror 28 (direct the first current Iv to the capacitor). In a second state, the switch 26 may connect the capacitor 34 to the fourth current mirror 30. The fourth current mirror 30 generating the third current (Iv+Ii). In a third state, the control switch 36 may connect the capacitor to a fixed reference voltage such as ground 42.

During the first state of the control switch 36, the capacitor 34 is charging. During the second state of the switch 34, the capacitor 34 is discharging. During the third state of the switch 34, the capacitor 34 is being clamped to a predetermined level such as ground.

The states of the switch 34 may be activated using timing signals T1, T2, and T3. The ring trip detector 38 may generate the timing signals T1, T2, and T3 using a square wave signal in combination with the output signal of the comparator 32. Ring trip detector operation is further discussed below.

During the first half-cycle of the square wave signal, timing signal T1 is generated to activate the first state of the switch so that the capacitor may be charged as a current source. During the second half-cycle, timing signal T2 is generated to activate the second state of the switch so that the capacitor may be discharged as a current sink.

As long as the measured loop current is non-zero, the discharge period will always be less than the charge cycle. To ensure that the loop current is non-zero, the charging and discharging of the capacitor 34 may be conducted when a subscriber off-hook condition has been detected by the SLIC.

During the remainder of the second half-cycle of the square wave signal and after the capacitor 34 has been discharged completely or to a predetermined level, timing signal T3 may be generated to activate the third state of the switch so that the capacitor voltage may be held at a reference potential such as ground.

The comparator 32 compares the voltage across the capacitor 34 to a reference voltage across resistor Rref 22. If the voltage across the capacitor 34 is above the reference voltage, then the comparator may generate a high output signal. If the voltage across the capacitor 34 is at or below the reference voltage, then the comparator may generate a low output signal.

The reference voltage across the resistor Rref 22 may be varied. The reference voltage across Rref 22 may be varied by using the control switch 36 to direct a reference current from the ring trip detector 38 to the resistor Rref 22. The reference voltage may be set to zero by deactivating the control switch 36 prohibiting the flow of the reference current to the resistor Rref 22. Switching the reference current to the resistor Rref 22 may be a function of the control switch 36 in addition to the three states discussed above.

Timing signal T1 is of a predetermined length. While T1 is being generated, the capacitor 34 may be charging (the first state of the switch) and the control switch 36 is directing a reference current to the resistor Rref 22. The magnitude of the reference current is such that voltage across the capacitor will always be below the voltage across the resistor Rref. Maintaining the reference voltage at a level higher than the voltage across the capacitor results in the comparator 32 generating a high output signal during timing signal T1.

At the end of the duration of the T1, the timing signal T2 is generated. The duration of T2 is not predetermined. During the duration of the T2 signal, the reference voltage may be set to zero (e.g., deactivate switch to prohibit the further flow of the reference current to the Resistor Rref 22). Also, during the duration of the T2 signal, the capacitor 34 is being discharged (control switch 36 is directing the third current [Ii+Iv] to the capacitor). When the capacitor 34 is discharging, the output signal of the comparator 32 is a low signal. When the capacitor is discharged to a predetermined level such as the reference voltage zero, the output signal of the comparator 32 transitions to a high signal. The high output signal of the comparator 32 may be provided to the ring trip detector 38. In response, the ring trip detector 38 may generate a timing signal T3 activating the third state of the switch clamping the capacitor to a predetermined voltage level (e.g., shorting out the capacitor 34 by connecting the capacitor 34 to ground).

The capacitor 34 is clamped during timing signal T3 because leakage current during T3 may trigger the comparator causing invalid measurements. In addition, the ability to clamp the capacitor 34 may be useful in other non-ringing non-test states. The capacitor 34 may also be used in the ring trip detect function when it is not being used for line impedance measurement.

During timing signal T3, the output signal of the comparator 32 remains high since the voltage across the capacitor 34 is at or below the voltage across the resistor Rref 22.

The time interval between output signal level changes of the comparator may be measured using a counting technique where the comparator output gates a high frequency clock signal into a counter. The time interval of the timing signal T2 is the interval of interest. During the time interval for T2, the output of the comparator 32 is low. To measure the duration of the interval, the output of the comparator 32 may be received by a NAND gate 46 which inverts the received signal to provide a high output signal. The high output signal from the NAND gate 46 may be directed to an N-bit binary counter 48 which is gated with a high frequency clock signal. Using the high frequency clock signal, the N-bit binary counter 48 counts the duration of the high output signal (time interval of T2) from the NAND gate 46.

The count may be used as an address pointer for identifying a location in memory ($N^{2n} \times M$ bits) 50. Each location in memory 50 may store a predetermined loop impedance value corresponding to the duration of timing signal T2 as measured by the N-bit binary counter 48.

Figure 2:
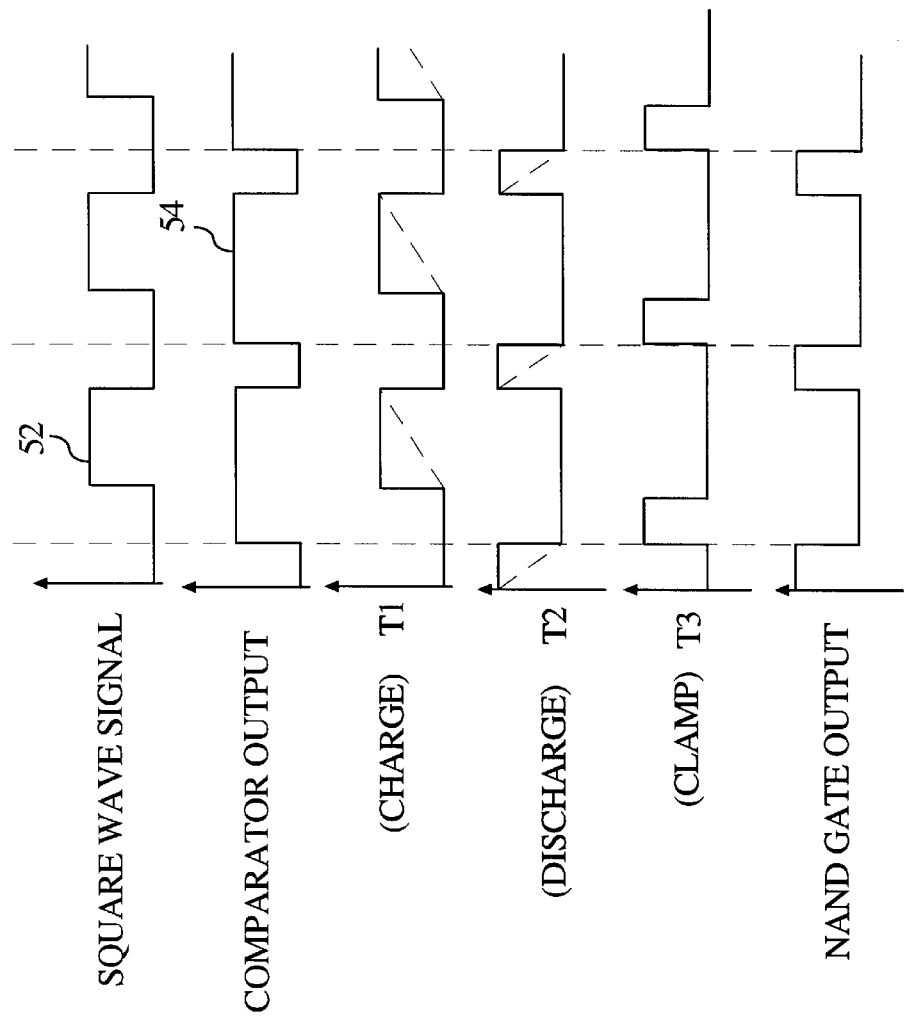
FIG. 2 is a timing diagram illustrating output signals of circuitry of one embodiment of a subscriber loop interface circuit of the present invention.

With reference to FIGS. 1 and 2, the square wave signal 52 having a one-to-one mark space ratio may be used to define the duration of timing signal T1 (e.g., the first half of the square wave signal 52 being the duration of timing signal T1). The end of the first half of the square wave signal 52 may be used to initiate the timing signal T2 and to set the comparator output signal 54 to a low signal. As discussed above, the comparator output signal 54 is set low by setting the voltage across resistor Rref 22 to a predetermined level (e.g., zero volt) below the voltage across the capacitor 34. When the capacitor 34 has discharged to the predetermined level, the comparator output signal 54 raises to a high signal. The transition to high signal is received by the ring trip detector 38 which triggers the timing signal T3. The timing signal T3 lasts for the remaining duration of the second half of the square wave signal 52. The charging and discharging cycle repeats again at the beginning of the first half of the square wave signal 52.

The ring trip detector 38 may receive a control signal for controlling ring trip detector states. For example, the control signal may dictate that the ring trip detector perform a ring detect function or an impedance measurement function.

Figure 3:
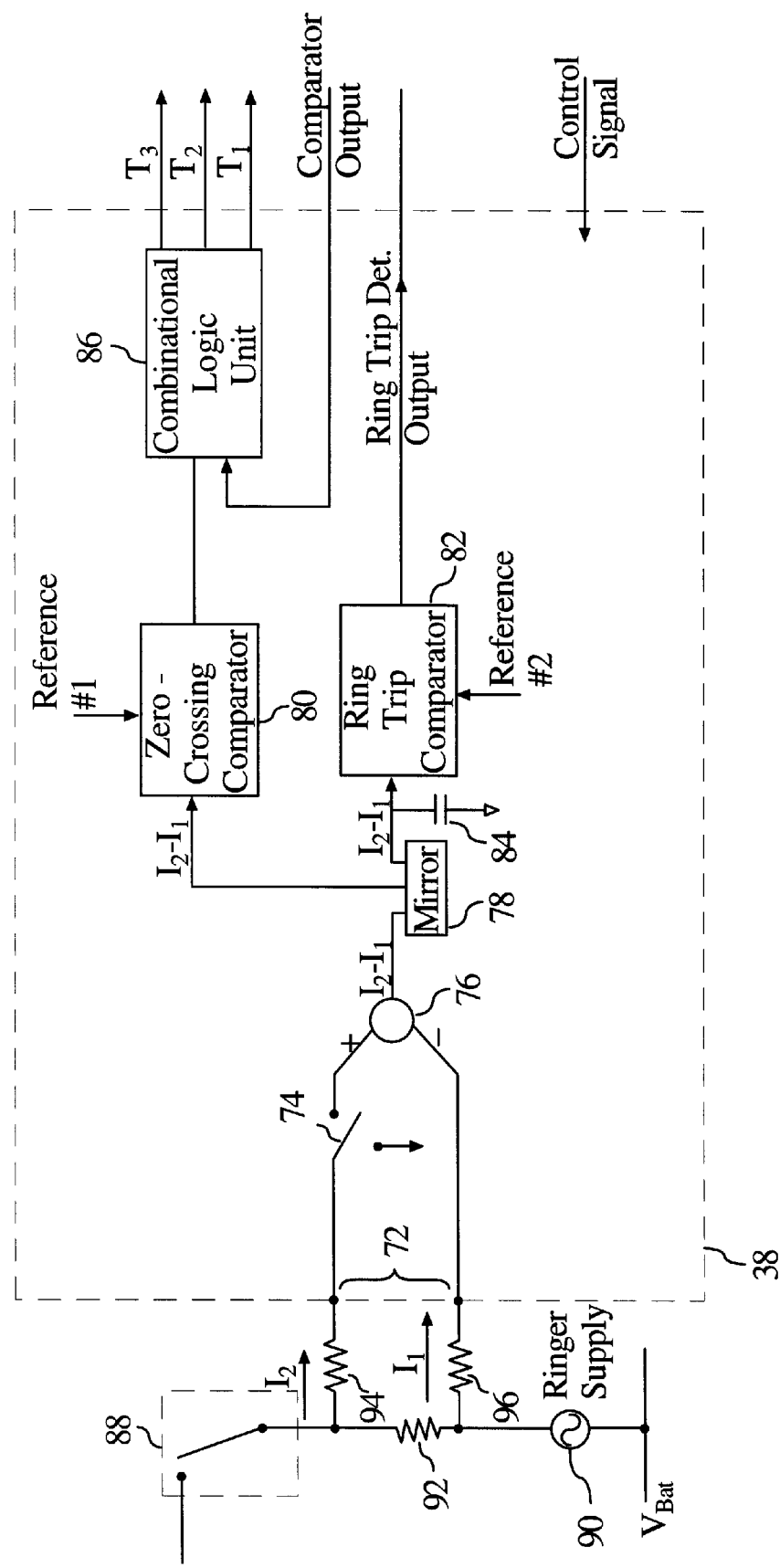
FIG. 3 is a functional block diagram illustrating one embodiment of a ring trip detector of the present invention.

With reference to FIG. 3, a ring trip detector 38 may include a pair of terminals, a switch 74, a current summer 76, a current mirror 78, a zero crossing comparator 80, a ring trip comparator 82, a capacitor 84, and a combinational logic unit 86. Circuitry outside the ring trip detector 38 may include a ring relay switch 88, a ring signal supply 90, and three resistors 92, 94, and 96.

In operation, the ring signal supply generates a periodic signal which is directed through the three resistors 92, 94, and 96. If the ring relay switch 88 is closed, a signal is being directed to a subscriber terminal device (not shown) for ringing the subscriber terminal device. The ring relay switch 88 may be disconnected while loop impedance measurements are being conducted. If the ring relay switch 88 is disconnected, the entire signal generated by the ring signal supply 90 and the three resistors 92, 94, and 96 is being directed to the ring trip detector 38 through the terminals 72. The current through each terminal 72 (I1 or I2) is approximately equal and typically remains equal as long the ring relay switch 88 is not connected. Currents I1 and I2 correspond to the ring signal illustrated in FIG. 1.

With further reference to FIG. 3, the switch 74 may be activated in the loop impedance measurement state of the ring trip detector 38. In the loop impedance measurement state, the switch 74 may be connected to a reference such as ground to unbalance the current I1 and I2. The currents I1 and I2 may be received by the current summer 76 to generate an output current I2−I1. Typically, if the ring trip detector is not in the loop impedance measurement state, the output current of the current summer 76 is approximately zero (since I2 and I1 would be approximately equal). During the loop impedance measurement state, the switch unbalances I2 and I1 so that output of the current summer 76 resembles the periodic signal generated by the ring signal supply 90.

In the loop impedance measurement state, the mirror generates a mirror of current signal I2−I1. The mirror signal of I2−I1 may be directed to the zero-crossing comparator 80. The zero-crossing comparator 80 may compare the mirror signal to a constant current reference. For example, the zero-crossing comparator may compare the mirror signal I2−I1 to a zero reference to detect when the mirror signal I2−I1 crosses a zero.

The zero-crossing comparator 80 may then generate a square wave signal (one to one mark space ratio) as a function of the periodic signal of the ring signal supply 90. The output of the zero-crossing comparator 80 may transition between two states at the detection of each zero-crossing of the mirror signal I2−I1. The periodic transition provides a square wave signal (see FIG. 2) for generating timing signals T1, T2, and T3.

The square wave signal generated by the zero-crossing comparator 80 may be directed to the combinational logic unit 86. The output of the combinational logic unit 86 may be timing signals T1, T2, and T3. Timing signals T1, T2, and T3 may be provided to the control switch (See FIG. 1, control switch 36). The combinational logic unit 86 may generate timing signal T1 during the first half of the square wave signal. At the end of the first half of the square wave signal, the combinational logic unit 86 may generate timing signal T2. In response to a transition of the comparator output signal, the combinational logic unit 86 may terminate timing signal T2 and generate timing signal T3 for remainder of the second half of the square wave signal. At the end of the second half of the square wave signal, the cycle repeats again. Timing signals T1, T2, and T3 may also be placed only on a single line directed to the control switch.

Typically, the ring trip comparator 82 and capacitor are portions of a ring trip detector. The ring trip comparator 82 and the capacitor 84 are used to detect an off-hook subscriber condition while the ring relay switch 88 is connected.

The capacitor 84 may have more than one function. The capacitor 84 may be used in performing the ring trip detection function and the capacitor 84 may be the capacitor that is being charged and discharged in performing the loop impedance measurement function (e.g., capacitor 34, FIG. 1).

Using the contents of a counter (e.g., N-bit binary counter of FIG. 1), subscriber loop impedance may be determined by solving the conservation of charge equation for capacitors. It is to be understood that in the following description, the symbols T, T1, T2, and T3 indicate time durations. Accordingly, in the following description, T1 indicates the duration of timing signal T1; T2 indicates the duration of timing signal T2; T3 indicates the duration of timing signal T3. The conservation of charge equation for capacitors is:

$$Q=C*V \text{ or } V=Q/C=I*T/C. \tag{1}$$

Equating the charge during the charging and discharging of the capacitor provides:

$$(Iv*T1)/C=((Iv+Ii)*T2)/C \tag{2}$$

where Iv is the first current, Ii is the second current, T1 is the time of charging, T2 is the time of discharging, and C is the capacitance of the capacitor 34. Equation (2) may be simplified to provide:

$$Iv*(T1-T2)=Ii*T2. \tag{3}$$

Equation (3) may be rewritten as:

$$Iv/Ii=T2/T3 \tag{4}$$

where T3 is the time period in which the capacitor is maintained at a constant voltage by a clamp (i.e., T1−T2).

Information on the loop impedance "Rloop" may be obtained from the ratio in equation (4). If T2 equals zero, Iv is zero and Rloop is zero. If T3 equals zero, Ii is zero and Rloop is infinite. To avoid having an Ii value of zero, impedance measurement may be conducted when an off-hook condition has been detected.

In obtaining an impedance measurement, as T2 increases, T3 becomes very small and the resolution becomes too coarse. The time interval T2 may preferably be constrained to be no more than 80% of a half-cycle of the square wave signal. For example, T2 may be defined to be equal to or less than four times T3 so that when T2 is measured to be four times T3, the loop impedance may be considered to be at a maximum value (e.g., 2000 ohms). Most loop impedance values are in the range of zero to 2000 ohms.

The first current Iv may equal the value of the loop voltage "Vloop" divided by (N*R1'). The second current Ii may equal the value of the loop current "Iloop" divided by K1 (the scaling factor in the first current mirror). Substituting Iv and Ii of equation (4) with their scaling formula provides:

$$(Vloop*K1)/(R1*Iloop)=(T2/T3). \tag{5}$$

Substituting T2 with 4 * T3 provides:

$$Vloop/Iloop=Rloop=(4*R1)/K1. \tag{6}$$

Therefore, the loop impedance measurement is not dependent on the capacitance of the capacitor which may vary due to manufacturing tolerances and over-temperature variations.

If the maximum loop voltage to be measured is 50 V and the maximum loop current to be measured is 25 mA, and if the second current Ii is set to be 1 mA, then from the above equations K1 may be determined to be 25 and R1 may be determined to be 12.5 k Ohms. Prior to use, K1 and R1 may be scaled further. R1 and K1 may be distributed throughout the SLIC.

Typically, loop voltage Vloop is scaled by a factor of twenty (i.e., the value of N in the scaling circuit 14) and the voltage across the capacitor is limited to 1.25 V. If the capacitor 34 has a capacitance of 0.1 uF and the square wave signal is generated at a frequency of 20 Hz (T1=½*1/20), then the scaling factors, R1 and K1, may be determined by the following:

$$Q = IT1 = CV \quad (7)$$

$$I = CV/T1 = 0.1 \ast 10^{-6} \ast 1.25/(\tfrac{1}{2} \ast \tfrac{1}{20}) \quad (8)$$

$$I = 5 \text{ uA}$$

$$K1 = 25 \text{ mA}/5 \text{ uA} = 5000$$

$$R1 = 500 \ast K1 = 2.5 \text{ M ohms.}$$

The value of R1 includes the scaling factor of twenty. Therefore, the physical resistor may have a resistance of 2.5 M/20=125 k ohms. The value of R1 may be further reduced to a practical on-chip value by scaling the resulting current.

The signal information indicating the line impedance may be placed on a single lead of the SLIC. One such lead may be the ground key detect lead. One reason for using the ground key detect lead as an output lead may be that a central office may mistake the measurement output signal waveform which is at the ring frequency for loop disconnect dial pulses where fast dialing is used (20 pps).

If a ground key lead is not available then the information may be placed on a switch hook detector lead. In general, using the switch hook detector lead will not interfere with a conventional off-hook detect signal (a continuous active low signal). The pulsing output generated from measuring impedance may be unambiguously recognized from the continuous low off-hook signal. A pulsing output may be ensured by conducting measurements only during a subscriber off-hook condition.

In subscriber networks employing Maintenance Termination Unit (MTU) equipment, remote loop-back switches at customer premises may be activated for the purpose of continuity testing. In such networks, activating a remote loop-back switch may produce a continuous off-hook signal. Information on loop impedance may then be obtained by conducting measurements while a subscriber on-hook condition is present.

For subscriber loops having a loop resistance beyond 2000 ohms, a higher resistance range may be selected by selecting appropriate scaling factors.

The discharge interval T2 may be measured by generating a signal while the capacitor is discharging that gates a high frequency clock signal into a counter. The contents of the counter may be converted into an impedance value preferably by using the contents of the counter as an address for retrieving information from memory. The address may point to an entry in a look-up table previously loaded with impedance values.

The impedance values may be determined from the following:

$$Rloop = (R1 \ast T2)/(K1 \ast T3). \quad (9)$$

For a 1:1 mark space ratio square wave timing signal, T3 equals T1−T2 and the impedance value may be:

$$Rloop = (R1 \ast T2)/(K \ast (T1 - T2)). \quad (10)$$

The time interval T1 may be a predetermined interval (e.g., first half-cycle of a square wave signal). R1 and K1 may also be predetermined so that a look-up table may be generated by calculating Rloop for possible values of T2. The size of the table will generally depend upon the clock rate. A clock frequency of 20 Hz*250 or 2.5 kHz may break the loop resistance range into 100 unequal increments with the longest loop lengths having the least resolution. Resolution for longer loop lengths may be increased by increasing the clock rate, or dividing the measurement period (T2) into two or more intervals, and by using a higher clock frequency as the measurement period extends from one portion of the T2 interval to the next.

A look-up table may only be valid for the square wave signal frequency used to calculate impedance values. The square wave signal frequency may be related to the ringing frequency which may be different among countries or different even within a country. In addition, distinctive ringing may require several different frequencies. If the frequency of the square wave signal is different from the frequency used to generate an impedance value look-up table, the clock frequency must be scaled or the lookup table be recalculated.

The frequency selected for the square wave signal may preferably be low enough so that fluctuations in loop voltage and loop current will be averaged and filtered by the capacitor. The capacitor 34 and the comparator 32 may also be for use by the ring trip detector 38.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a semiconductor circuit, a subscriber loop interface circuit comprising:
    a loop voltage sensor for sensing loop voltage;
    a first current generator for generating a first current proportional to the sensed loop voltage;
    a loop current sensor for sensing loop current;
    a second current generator for generating a second current proportional to the sensed loop current;
    means for adding the second current to the first current to provide a third current; and
    a loop impedance measurer for determining loop impedance from said first and third currents.

2. The circuit of claim 1, wherein said loop impedance measurer comprises a capacitor.

3. The circuit of claim 2, wherein said loop impedance measurer includes:
    means for directing the first current to said capacitor to charge said capacitor, and for directing the third current to said capacitor to discharge said capacitor;
    means for determining the discharge time of the capacitor; and
    means for determining loop impedance as function of the determined discharge time.

4. The circuit of claim 3, wherein said means for directing includes a switch connected to said capacitor.

5. The circuit of claim 4, wherein said loop impedance measurer includes a square wave signal generator connected to said switch for periodically generating a square wave signal whereby said switch is periodically activated.

6. The circuit of claim 5, wherein said loop impedance measurer includes:
    means for detecting a level of discharge of the capacitor; and
    a clamp for holding the capacitor at about or below the detected level of discharge.

7. The circuit of claim 6, wherein said loop impedance measurer includes means for deactivating said clamp when the square wave signal generated by said square wave generator transitions to thereby allow the capacitor to charge.

8. The circuit of claim 7, wherein said loop impedance measurer shares circuitry with other portions of the subscriber loop interface circuit.

9. The circuit of claim 7, wherein said loop impedance measurer shares said capacitor, said square wave generator, and said switch with other portions of the subscriber loop interface circuit.

10. The circuit of claim 5, wherein said loop impedance measurer comprises a lookup table for providing an impedance corresponding to the determined discharge time.

11. A method for determining loop impedance comprising the steps of:

(a) sensing loop voltage;

(b) generating a first current proportional to the sensed loop voltage;

(c) directing the first current to a capacitor to charge the capacitor;

(d) sensing loop current;

(e) generating a second current proportional to the sensed loop current;

(f) summing the second current and the first current to provide a third current, the third current being greater in magnitude and opposite in polarity to the first current;

(g) directing the third current to the capacitor to discharge the capacitor;

(h) determining the discharge time of the capacitor; and (i) determining loop impedance as a function of the discharge time.

12. The method of claim 11, wherein substantially all the steps are performed internal to a subscriber loop interface circuit.

13. The method of claim 12, wherein the subscriber loop interface circuit is an integrated semiconductor circuit.

14. The method of claim 11, wherein steps (a) through (h) are repeated periodically.

15. The method of claim 11, wherein the subscriber loop interface circuit includes a switch for switching the capacitor from charging to discharging.

16. The method of claim 15, further comprising the step of generating a square save signal for periodically activating the switch.

17. The method of claim 16, further comprising the steps of:

providing a clamp;

detecting a level of discharge of the capacitor; and activating the clamp to hold the capacitor at the detected level of discharge.

18. The method of claim 17, further comprising the step of deactivating the clamp to allow the capacitor to charge in response to the next transition of the square wave signal.

19. The method of claim 11, further comprising the step of providing the impedance from a look-up table as a function of a predetermined relationship between capacitor discharge time and loop impedance.

20. The method of claim 11, wherein loop impedance is only determined while an off-hook indication in the SLIC is present.

* * * * *